United States Patent
Nakazawa et al.

(10) Patent No.: US 6,549,475 B2
(45) Date of Patent: Apr. 15, 2003

(54) SEMICONDUCTOR MEMORY DEVICE AND INFORMATION DEVICE

(75) Inventors: Ken Nakazawa, Tenri (JP); Ken Sumitani, Tenri (JP); Haruyasu Fukui, Yoshino-gun (JP); Yasumichi Mori, Ikoma (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 10/183,857

(22) Filed: Jun. 25, 2002

(65) Prior Publication Data

US 2003/0021163 A1 Jan. 30, 2003

(30) Foreign Application Priority Data

Jun. 28, 2001 (JP) ........................................ 2001-197538

(51) Int. Cl.$^7$ .............................................. G11C 16/04
(52) U.S. Cl. ........................... 365/189.12; 365/189.02; 365/230.02
(58) Field of Search ....................... 365/189.12, 189.02, 365/230.02

(56) References Cited

U.S. PATENT DOCUMENTS

| 5,245,572 | A | * | 9/1993 | Kosonocky et al. | ... 365/185.11 |
| 5,361,343 | A | * | 11/1994 | Kosonocky et al. | ... 365/185.11 |
| 5,724,553 | A | * | 3/1998 | Shigeeda | ..................... 711/170 |
| 6,240,032 | B1 | * | 5/2001 | Fukumoto | .................... 365/222 |
| 2001/0053090 | A1 | | 12/2001 | Takata et al. | .......... 365/185.08 |

FOREIGN PATENT DOCUMENTS

JP          2001-357684          12/2001

OTHER PUBLICATIONS

Derwent® English Abstract of JP 2001–357684 published on Dec. 26, 2001.

* cited by examiner

Primary Examiner—Michael S. Lebentritt
Assistant Examiner—Tuan T. Nguyen
(74) Attorney, Agent, or Firm—Morrison&Foerster LLP

(57) ABSTRACT

A semiconductor memory device in which an input command controls an operation includes a command state machine for decoding the input command and outputting the decoding result; a plurality of status registers for storing state information of the semiconductor memory device; a first switching circuit for receiving data from the plurality of status registers, and selectively outputting the data from at least one of the plurality of status registers to a first data bus; and a second switching circuit for receiving the data on the first data bus and data from a sense amplifier, and selectively outputting either one of data to a second data bus. At least the first switching circuit, among the first and second switching circuits, is controlled by the decoding result output by the command state machine.

27 Claims, 8 Drawing Sheets

FIG.3

Status register (SR)

| WSMS | ESS | ES | DWS | VPPS | ADD0 | ADD1 | R |
|------|-----|----|----|------|------|------|---|
| 7 | 6 | 5 | 4 | 3 | 2 | 1 | 0 |

FIG.4

Status register (SR)

| WSM | ESS | ES | DWS | VPPS | SRB | SRA | R |
|-----|-----|----|----|------|-----|-----|---|
| 7 | 6 | 5 | 4 | 3 | 2 | 1 | 0 |

FIG. 6

Transfer status register (TSR)

| WSMS | HPS1 | HPS0 | TS | VCCWS | TSS | DPS | 1 |
|------|------|------|----|-------|-----|-----|---|
| 7 | 6 | 5 | 4 | 3 | 2 | 1 | 0 |

FIG. 7

Command status register (CSR)

| WSMS | BESS | ECS | WBWS | VCCWS | WBWSS | DPS | 0 |
|------|------|-----|------|-------|-------|-----|---|
| 7 | 6 | 5 | 4 | 3 | 2 | 1 | 0 |

SEMICONDUCTOR MEMORY DEVICE AND INFORMATION DEVICE

BACKGROUND OF THE INVENTION

1. Field of the Invention

The present invention relates to a semiconductor memory device including a status register for storing various operation states of a memory array capable of data write or erase, and an information device using the same, for example, a computer or an information mobile device.

2. Description of the Related Art

One of semiconductor memory devices capable of storing information even after supply of power is stopped is a flash memory (or a flash EEPROM (Electrically Erasable and Programmable ROM)). The flash memory has a function of electrically erasing data in memory cells in the entire chip or a certain area in the chip (sector or block) in globally. Thus, the flash memory allows the area of a memory cell to be as small as that of an EPROM (Erasable and Programmable ROM).

In such a flash memory (nonvolatile semiconductor memory device), the memory arrays are in a greater number of operation states (for example, write, block erase, global erase of the entire chip, and read of the status register) than in a RAM (Random Access Memory) capable of performing information read and write within a short time period. In conventional EPROM or EEPROM, such a great number of operation states cannot correspond, one to one, to combinations of external control signals (for example, a chip enable signal (/CE), a write enable signal (/WE) and an output enabler signal (/OE)). The reason is that the number of control signals are not sufficient for all the operation states of the memory arrays. Therefore, it is necessary to add new control signals.

However, addition of the new control signal lines results in less ease in use. Therefore, a system of performing controls by commands is mainly used today.

FIG. 9 is a block diagram showing a partial structure of a conventional nonvolatile semiconductor memory device 100. As shown in FIG. 9, the nonvolatile semiconductor memory device 100 includes a memory array 120, a command state machine (CSM) 102, a write state machine (WSM) 103, a row decoder 104, a column decoder 105, a block selection circuit 106, a status register (SR) 107, block protect setting sections (BPs) 108, a data switching circuit 109, a block status register (BSR) 110, a data bus 112, an address bus 113, a reset signal input line 114, an erase/write voltage generation circuit 115, and a sense amplifier 116.

The memory array 120 includes a plurality of erase blocks 101 (erase blocks 1 through n) each including a plurality of memory cells.

The command state machine 102 (hereinafter, referred to as the "CSM 102") decodes an input command 111 and transfers the decoding result (for example, block erase or write) to the write state machine 103. The CSM 102 is connected to, for example, a command input line and a reset signal input line 114. In synchronization with the command 111 or a reset signal R externally input to the CSM 102, the input levels of a chip enable signal /CE, a write enable signal/WE, an output enable signal /OE and the like change.

The write state machine 103 (hereinafter, referred to as the WSM 103) executes various operations (for example, block erase/write) in accordance with the decoding result of the input command 111. More specifically, when a block which is selected by the block selection circuit 106 (described below) is not in, for example, an erase prohibition state (a block lock state), the WSM 103 can globally erase the data in the block. When the block is in the block lock state, the WSM 103 does not rewrite the data stored in the block.

The row decoder 104 sequentially selects word lines (not shown) in the memory array 120 so as to electrically connect each of the memory cells in each row connected to the selected word line to a corresponding bit line.

The column decoder 105 selects one of a plurality of bit lines (not shown) in the memory array 120 so as to connect the selected bit line to the sense amplifier 116 (described below).

The block selection circuit 106 selects one of the n number of erase blocks 101.

The status register 107 (hereinafter, referred to as the "SR 107") stores the data representing an operation state of the memory array 120 (for example, block erase/write).

The block protect setting sections 108 (hereinafter, referred to as the "BPs 108") are each a control bit for locking or unlocking an erase block 101 corresponding thereto. Data indicating whether each erase block 101 is locked or unlocked is stored in the block status register 110 (hereinafter, referred to as the "BSR 110") of each erase block 101 as described below.

The data switching circuit 109 selects one of data stored in the memory array 120, data stored in the SR 107 or data stored in the BSR 110 to be read.

The BSR 110 corresponding to each erase block 101 stores data indicating whether the corresponding erase block 101 is in a locked state or an unlocked state. The BSR 110 also stores data indicating which erase block 101 is selected by an address externally designated.

The command 111 is a command signal as a control instruction which is input by the user. The command 111 instructs execution of various operations (for example, block erase/write).

The data bus 112 has a 16-bit width in order to allow data D to be transferred between the CSM 102 or the data switching circuit 109 and external devices. The data bus 112 is not limited to having a 16-bit width, and may have, for example, a 24-bit or 32-bit width.

The address bus 113 receives an address signal A, and the reset signal line 114 receives a reset signal R.

The erase/write voltage generation circuit 115 is provided for erase or write. The erase/write voltage generation circuit 115 receives a prescribed voltage from an external power supply Vcc, and when necessary, generates a high voltage of about 12 V. For executing a negative gate erase, the erase/write voltage generation circuit 115 generates a negative potential.

The sense amplifier 116 amplifies the bit line voltage selected by the column decoder 105 so as to sense information stored in the selected memory cell.

The nonvolatile semiconductor memory device having the above-described structure operates as follows.

When the user inputs the command 111, the CSM 102 decodes the command 111 and outputs the decoding result to the WSM 103. The WSM 103 executes a memory operation in accordance with the command 111 (for example, block erase/write).

For example, a block erase operation is usually performed as follows. First, one of the erase blocks 101 to be erased is selected, and data "0" is written in all the memory cells (not shown) in the selected erase block 101 (i.e., threshold voltage Vth in the memory cell transistor is changed to a HIGH level).

Next, when the threshold voltage Vth of all the memory cells in the selected erase block 101 becomes equal to or higher than a prescribed value, data stored in the memory cells in the erase block 101 is globally erased (i.e., the threshold voltage Vth is changed to a LOW level).

This series of operations are controlled by the WSM 103, and the result of the operations (for example, the result that the data in the erase block 101 has been erased) is stored in the SR 107 and in the corresponding BSR 110 as data which represents the operation state of the memory array 120.

In order to read the data stored in the SR 107 and the data stored in the BSR 110, the conventional flash memory needs to be operated as follows.

While the WSM 103 is executing a command, 8-bit data stored in the SR 107 can be read, not the data stored in the memory array 120, by changing the chip enable signal /CE and the output enable signal/OE to a LOW (active) level so as to perform a read operation. Even when a 16-bit data bus is used, the data stored in the SR 107 is output to the lower 8 bits and the upper 8 bits are not used, regardless of the designated address.

Data stored in the SR 107 will be described using a part of FIG. 3 (described below). As shown in FIG. 3, the SR 107 stores, for example, the following data which represents the operation states of the memory array 120: WSMS (indicating whether the WSM 103 is in a ready state or a busy state), ESS (indicating whether WSM 103 is in an erase interrupt state, or an erasing or erase completion state), ES (indicating whether WSM 103 is in a block erase error state or in a block erase success state), DWS (indicating whether WSM 103 is in a data write error state or a data write success state), VPPS (indicating whether WSM 103 is in a VPP low potential detection or operation stop state or in a VPP normal state). The above-mentioned data is stored in bits 7 through 3.

For example, in bit 7 of the SR 107, a bit representing the operation state of the WSM 103 (WSMS bit) is stored. The value "1" of the WSMS bit represents the ready state, and the value "0" of the WSMS bit represents the busy state (in execution).

In bit 6 of the SR 107, a bit representing the erase interrupt state (ESS bit) is stored. The value "1" of the ESS bit represents the erase interrupt state, and the value "0" of the ESS bit represents the erasing or erase completion state.

In bit 5 of the SR 107, a bit representing the block erase (ES bit) is stored. The value "1" of the ES bit represents the block erase error state, and the value "0" of the ES bit represents the block erase success state.

In bit 4 of the SR 107, a bit representing the data write state (DWS bit) is stored. The value "1" of the DWS bit represents the data write error state, and the value "0" of the DWS bit represents the data write success state.

In bit 3 of the SR 107, a bit representing the VPP state (VPPS bit) is stored. The value "1" of the VPPS bit represents the VPP low potential detection or operation stop state, and the value "0" of the VPPS bit represents the VPP normal state.

In the conventional flash memory, bits 2 through 0 of the SR 107 may be different from those shown in FIG. 3. In the conventional flash memory, bits 2 through 0 are reserved for future expansion functions, and therefore need to be masked when the SR 107 is polled.

When using the data stored in the SR 107, it is necessary to first check the state of external terminals RY/BY# provided for outputting the WSMS bit or information equivalent to the WSMS bit so as to confirm that the operation (for example, erase interrupt, erase, or data write) has been completed. Then, it is necessary to confirm that the corresponding status bit (the ESS bit, ES bit or DWS bit) represents success.

When the DWS bit and the ES bit are set to be "1" in the block erase operation, this means that a wrong command sequence has been input. In this case, it is necessary to clear the data stored in each bit and perform the operation again.

The VPPS bit represents the VPP level, but does not continuously represent the VPP level. The WSM 103 checks the VPP level only after the command sequence for data write or erase is input, and shows the result.

In the case where the BSR 110 representing the state of each erase block is built in the nonvolatile semiconductor memory device 100, a read command for the BSR 110 is issued so as to read the 8-bit data stored in the BSR 110. Even when the 16-bit bus is used, the upper 8 bits of the bus are not used and the data in the BSR 110 corresponding to the selected address bus is output to the lower 8 bits of the bus.

A flash memory having a function of two-chip memory arrays built in one package is available today. As an improvement over this type of flash memory, another flash memory has been developed in which while data is written to or erased from a one-chip memory array (e.g., a first memory array), data can be read from the memory array of the other chip (e.g., a second memory array).

The above-described conventional flash memories have the following problems.

The number of bits of one status register for representing the status of the memory chip is limited. Therefore, the number of statuses which can be represented by one status register is restricted.

For example, one chip flash memory including a plurality of status registers is operated as follows in order to identify the state of the memory chip after, for example, data is erased from or written to the memory chip. The chip enable signal CE# and the output enable signal OE# are changed to a LOW level. Then, information stored in the status register can be read. However, it cannot be determined., only based on the information thus obtained, from which status register the information has been read.

In addition, when data is transferred to the flash memory from other memory chips out side or in side the package, the status register cannot show which address is now being processed by the data transferred. Namely, while a command is being executed for a certain range of addresses, it cannot be identified which address among the certain range of addresses is now being processed.

SUMMARY OF THE INVENTION

According to one aspect of the invention, a semiconductor memory device in which an input command controls an operation includes a command state machine for decoding the input command and outputting the decoding result; a plurality of status registers for storing state information of the semiconductor memory device; a first switching circuit for receiving data from the plurality of status registers, and selectively outputting the data from at least one of the plurality of status registers to a first data bus; and a second switching circuit for receiving the data on the first data bus and data from a sense amplifier, and selectively outputting either one of data to a second data bus. At least the first switching circuit, among the first and second switching circuits, is controlled by the decoding result output by the command state machine.

In one embodiment of the invention, at least one of the plurality of status registers includes identification information for exclusively identifying the status register.

In one embodiment of the invention, at least one of the plurality of status registers includes information on an address which is currently being processed with an operation designated by the input command.

In one embodiment of the invention, at least one of the plurality of status registers includes information on an address which is currently being processed with an operation designated by the input command.

In one embodiment of the invention, the semiconductor memory device includes a control section for, after the command is input, controlling the state information, stored in the plurality of status registers, to be externally output in accordance with a read control signal which is input to an external control terminal.

In one embodiment of the invention, the first data bus has a width which is equal to or less than a width of the second data bus.

According to another aspect of the invention, a semiconductor memory device, including a plurality of memory arrays which are independently operable and having a function of transferring data between the plurality of memory arrays, includes a plurality of status registers for storing state information of the plurality of memory arrays; a first switching circuit for receiving data from the plurality of status registers, and selectively outputting the data from at least one of the plurality of status registers to a first data bus; and a second switching circuit for receiving the data on the first data bus and data from a sense amplifier, and selectively outputting either one of the data to a second data bus.

In one embodiment of the invention, an input command controls an operation, the semiconductor memory device further comprising a command state machine for decoding the input command and outputting the decoding result, wherein the first switching circuit and the second switching circuits are controlled by the decoding result output by the command state machine.

In one embodiment of the invention, the plurality of status registers include a first status register group including at least one status register for storing state information regarding an operation common to the semiconductor memory device, and a second status register group including at least one status register for storing state information regarding a data transfer operation between the plurality of memory arrays.

In one embodiment of the invention, the plurality of status registers include a first status register group including at least one status register for storing state information regarding an operation common to the semiconductor memory device, and a second status register group including at least one status register for storing state information regarding a data transfer operation between the plurality of memory arrays.

In one embodiment of the invention, the first and second status register groups each include information which identifies whether the status register belongs to the first status register group or the second status register group.

In one embodiment of the invention, the first and second status register groups each include information which exclusively identifies the respective status register.

In one embodiment of the invention, the first and second status register groups each include information which exclusively identifies the respective status register.

In one embodiment of the invention, the second status register group includes information on an address which is currently being processed with an operation designated by the command.

In one embodiment of the invention, the semiconductor memory device includes a control section for, after the command is input, controlling the state information, stored in the first and second status register groups, to be externally output in accordance with a read control signal which is input to an external control terminal.

In one embodiment of the invention, the semiconductor memory device further includes a write state machine for receiving the decoding result of the command output by the command state machine and controlling execution of an operation designated by the command based on the decoding result, wherein the second status register group includes information which indicates whether or not the write state machine is currently executing the data transfer operation between the plurality of memory arrays.

In one embodiment of the invention, at least one of the plurality of memory arrays is capable of being accessed at a higher speed than other memory arrays. The at least one memory array capable of being accessed at a higher speed is divided into a plurality of pages, which are memory areas. The second status register group includes information which represents the page which is currently being involved in the data transfer operation between the at least one of the plurality of memory arrays capable of being accessed at a higher speed and the other memory arrays.

In one embodiment of the invention, the at least one of the plurality of memory arrays capable of being accessed at a higher speed is a static random access memory, and the other memory arrays include a nonvolatile semiconductor memory device capable of electrically writing and erasing data.

In one embodiment of the invention, the second status register group includes data transfer result information which indicates whether or not the data transfer operation between the plurality of memory arrays has successfully been completed.

In one embodiment of the invention, the semiconductor memory device further includes a supply voltage detection section for detecting a supply voltage, wherein the second status register group includes information which indicates whether or not the supply voltage is abnormal while the data transfer operation between the plurality of memory arrays is being executed.

In one embodiment of the invention, the second status register group includes information which indicates whether the data transfer operation between the plurality of memory arrays is currently being executed or interrupted.

In one embodiment of the invention, the semiconductor memory device further includes an information protection section for protecting stored information against a rewrite operation to the plurality of memory arrays, wherein the second status register group includes information which represents a protection state against the rewrite operation and also indicates that the data transfer operation has been interrupted by detecting the protection state when the command instructs the data transfer operation to the memory arrays which are protected against the rewrite operation.

In one embodiment of the invention, the first data bus has a width which is equal to or greater than a bit width of the first status register group or the second status register group.

In one embodiment of the invention, the first data bus has a width which is equal to or greater than a sum of a bit width of the first status register group and a bit width of the second status register group.

In one embodiment of the invention, the first data bus has a width which is equal to or less than a width of the second data bus.

According to still another aspect of the invention, an information device for performing at least one of a data transfer operation and a memory operation using any of the above-described semiconductor memory device.

As described above, a semiconductor memory device of the present invention includes a plurality of status memory sections, so that various operation states of the semiconductor memory device can be represented. The plurality of status memory sections are selected by the decoding result of the input command, without requiring a read control instruction (command) for each status. Therefore, the conventional status reading method is usable for the semiconductor memory device of the present invention.

By outputting contents stored in the plurality of status memory sections in combination, various operation states of a grater number of memory chips (memory arrays) can be represented. In this case also, the plurality of status memory sections are selected by the decoding result of the input command, without requiring a read control instruction (command) for each status. Therefore, the conventional status reading method is usable for the semiconductor memory device of the present invention.

In addition to confirming the busy state of the write state machine by bit 7 as in the conventional status memory section, the semiconductor memory device according to the present invention can identify the address which is currently being processed with the memory operation by a plurality of bits, for example, bit 2 and bit 1. The address(es) from which data can be read is identified before all the addresses are processed with the operation based on the command. Such an address can be identified only by reading the data in the status register as in the conventional device, with no special command or input/output bus being required. Therefore, the conventional status reading method is usable for the semiconductor memory device in the third example.

When one of the plurality of statuses is read without using any special command for reading data stored in the status memory section, the status data which is currently being read is identified by the bits of the status memory section. Therefore, the conventional status reading method is usable for the semiconductor memory device of the present invention.

Since there are two status memory sections for a command status and a transfer status, a greater number of operation states can be represented. Either the command status mode or the transfer status mode is selected in accordance with the command. Which mode is being used can be identified by the bits in the status memory section. Since each status memory section is selected by the command, any special command for reading the status register is not necessary. Therefore, the conventional status reading method is usable for the semiconductor memory device of the present invention. In the transfer status register mode, the address which is currently being involved in the data transfer can be identified. Therefore, even before data transfer from/to all the addresses is completed, data can be transferred to the address, from which data has been transferred.

Thus, the invention described herein makes possible the advantages of providing a semiconductor memory device for representing a larger number of operation states of a memory array with status registers, and an information device using such a semiconductor memory device.

These and other advantages of the present invention will become apparent to those skilled in the art upon reading and understanding the following detailed description with reference to the accompanying figures.

BRIEF DESCRIPTION OF THE DRAWINGS

FIG. 3 shows a bit structure of a status register in a semiconductor memory device according to a third example of the present invention;

FIG. 4 shows a bit structure of a status register in a semiconductor memory device according to a fourth example of the present invention;

FIG. 6 shows a bit structure of a transfer status register mode in a semiconductor memory device according to a fifth example of the present invention;

FIG. 7 shows a bit structure of a command status register mode in the semiconductor memory device according to the fifth example of the present invention;

DESCRIPTION OF THE PREFERRED EMBODIMENTS

Hereinafter, the present invention will be described by way of illustrative examples with reference to the accompanying drawings. In first through fifth examples, the present invention is applied to a nonvolatile semiconductor memory device (flash memory). The present invention is also applicable to other types of semiconductor memory devices including a status register, and information devices including a semiconductor memory device according to the present invention.

EXAMPLE 1

In the first example of the present invention, a nonvolatile semiconductor memory device includes a plurality of status registers and a status register selection circuit for selecting one of the plurality of status registers. Owing to such a structure, various operations of a memory array can be represented by the status registers.

Figure 1:
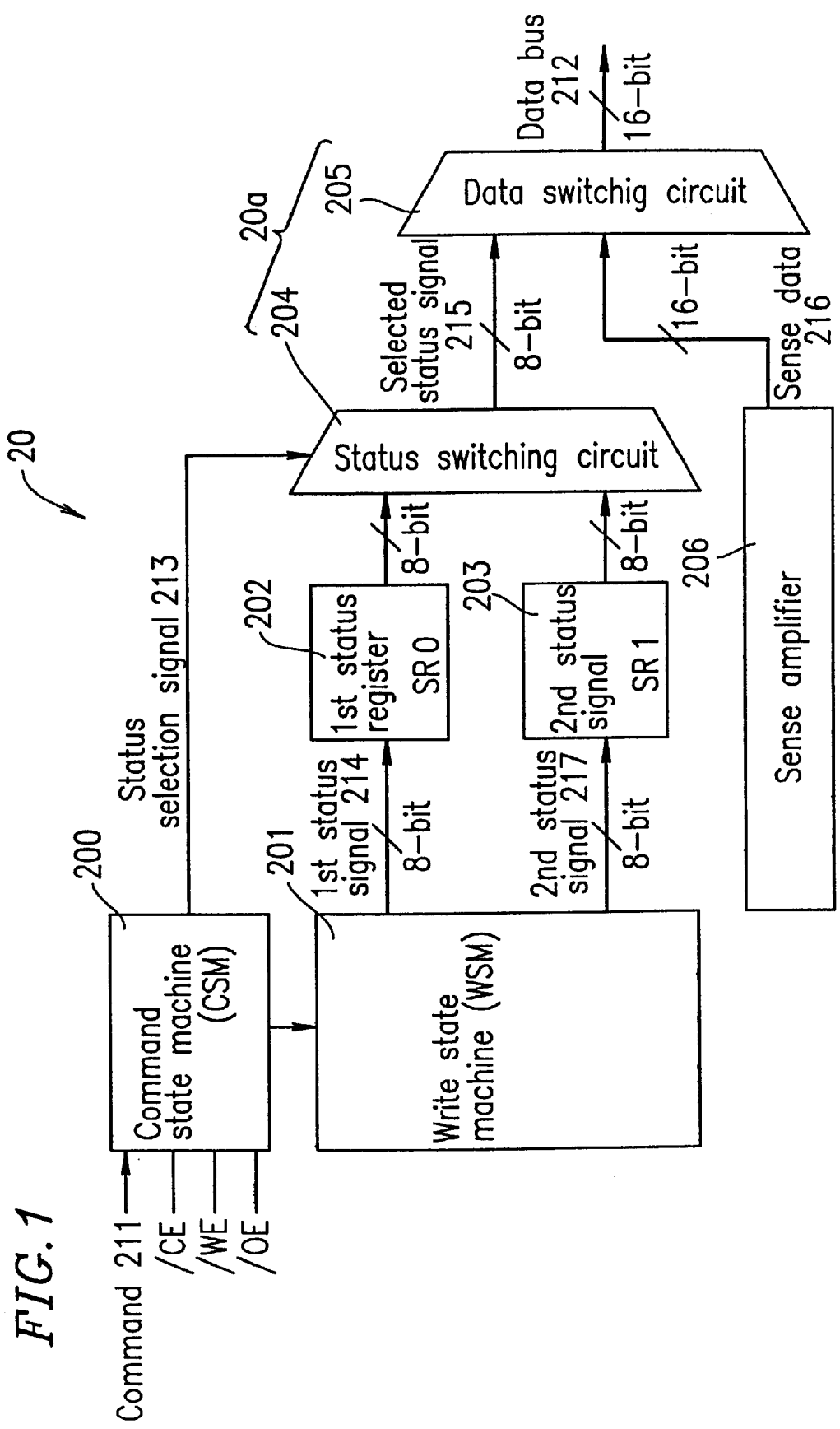
FIG. 1 is a block diagram illustrating a part of a nonvolatile semiconductor memory device including a status register selection circuit according to a first example of the present invention.

FIG. 1 is a block diagram illustrating a part of a nonvolatile semiconductor memory device 20 according to the first example of the present invention.

As shown in FIG. 1, the nonvolatile semiconductor memory device 20 includes a command state machine (CSM) 200, a write state machine (WSM) 201, a first status register 202 and a second status register 203 as a plurality of status memory sections, a status switching circuit 204 (first switching circuit) as a first status selection section (or a second status selection section) a data switching circuit 205 (second switching circuit) as a data switching section, and a sense amplifier 206 as a differential amplification section. A status register selection circuit 20a (control section) includes the status switching circuit 204, the data switching circuit 205 and the like. The status register selection circuit 20a further includes a 16-bit output data bus 212 in order to allow data to be transferred between the command state machine 200 and the data switching circuit 205 with external devices. The data bus 212 is not limited to having a 16-bit width, and may have, for example, a 24-bit or 32-bit width.

The write state machine 201 is connected to the first status register 202 via an 8-bit bus for a first status signal 214. The status switching circuit 204 is connected to the data switching circuit 205 via an 8-bit bus for a selected status signal 215. The write state machine 201 is connected to the second status register 202 via an 8-bit bus for a second status signal 217. The sense amplifier 206 is connected to the data switching circuit 205 via a 16-bit bus for sense data 216. The buses for the status signals 214, 215 and 217 are not limited to having an 8-bit width as long as the width is equal to or smaller than the width of the data bus 212, which is provided for outputting data from the data switching circuit 205 to an external device. When the width of the buses for the status signals 214, 215 and 217 is smaller than the width of the data bus 212, the signals can be output to, for example, lower bits of the data bus 212.

The command state machine 200 (hereinafter, referred to as the "CSM 200") includes a command recognition section for decoding a command 211 input thereto and transferring the decoding result to the write state machine 201, and a selected control signal generation section for outputting a status selection signal 213 as a selected control signal based on the decoding result of the command 211. As in the conventional device, input levels of control signals of a chip enable signal/CE, a write enable signal/WE and an output enable signal/OE change when these control signals are input to the CSM 200 in synchronization with the input of the command 211.

The write state machine 201 (hereinafter, referred to as the "WSM 201") includes a command operation execution section for executing various operations (for example, erase or write) in accordance with the command 211, and an operation state storage section for storing the various operation states of a memory array (not shown) or the like obtained as a result of executing the command 211 in the first status register 202 (SR0) and the second status register 203 (SR1).

The first status register 202 (hereinafter, referred to as "SR0") stores data regarding various operation states of the memory array or the like.

The second status register 203 (hereinafter, referred to as "SR1") stores data regarding various operation states of the memory array or the like, other than the data stored in SR0.

Based on the status selection signal 213 from the CSM 200, the status switching circuit 204 selects one of SR0 or SR1 which is directly relevant to the operation which is designated by the command 211 and outputs the status in the selected register to the data switching circuit 205 as the selected status signal 215. For example, when the status selection signal 213 is "0", the status switching circuit 204 selects SR0 and outputs the status in SR0, and when the status selection signal 213 is "1", the status switching circuit 204 selects SR1 and outputs the status in SR1. In the first example, two status registers are provided. Alternatively, three or more status registers may be provided. In such a case also, the data stored in the status register selected by the status selection signal 213 which is generated based on the command 211 is output. When the status selection signal 213 is 1 bit, one of two status registers can be selected. When the status selection signal 213 is 2 bits, at least one of four status registers can be selected. When the status selection signal 213 is 3 bits, at least one of eight status registers can be selected. The number of bits of the status selection signal 213 is determined by the number of status registers, which is provided for increasing the number of operation states which can be represented using the data stored therein.

The data switching circuit 205 selects either the sense data 216 obtained by sensing the information read from a selected memory cell in the memory array (not shown) by the sense amplifier 206 or the selected status signal 215, and outputs the selected data or signal to the data bus 212.

The sense amplifier 206 selects one of a plurality of word lines (not shown) in the memory array (not shown) by a row decoder (not shown) based on an input address, selects one of a plurality of bit lines (not shown) in the memory array by a column decoder (not shown), and electrically connects one of the memory cells corresponding to the selected word line with the selected bit line. Thus, the sense amplifier 206 senses the information stored in the selected memory cell.

An exemplary operation of the nonvolatile semiconductor memory device 20 having the above-described structure will be described.

When the command 211 is input to the CSM 200, the CSM 200 decodes the command 211 and transfers the decoding result to the WSM 201.

The WSM 201 executes an operation (for example, block erase/write) in accordance with the decoding result of the command 211. Data regarding the operation state of the memory array obtained as a result of executing the operation is output to SR0 (or SR1) as the first status signal 214 (or as the second status signal 217). The first status signal 214 is stored in SR0 (or the second status signal 217 is stored in SR1).

At this point, the status switching circuit 204 receives the status selection signal 213 based on the decoding result of the command 211 from the CSM 200. Thus, the status switching circuit 204 selects either SR0 or SR1 which is directly relevant to the operation designated by the command 211 and outputs the status in the selected register to the data switching circuit 205.

For reading data regarding the operation stored in SR0 or SR1, the levels of the chip enable signal/CE and the output enable signal/OE are changed to LOW (active) so as to perform a read operation while the WSM 201 is executing the command 211. Thus, the selected status signal 215 is selectively read to the data bus 212, not the data stored in the memory array, by the data switching circuit 205.

As described above, the nonvolatile semiconductor memory device 20 in the first example includes a plurality of status registers, so that a larger number of states of the memory chip can be represented. Either one of the plurality of status registers 202 or 203 is selected based on the decoding result of the command 211 by the CSM 201. Therefore, each status does not need its own command. Thus, the conventional status reading method is usable for the nonvolatile semiconductor memory device 20.

EXAMPLE 2

In the second example of the present invention, a nonvolatile semiconductor memory device includes a plurality of status registers and a status register selection circuit for selecting at least two of the plurality of status registers. Owing to such a structure, various operations of a memory array can be represented by the status registers.

Figure 2:
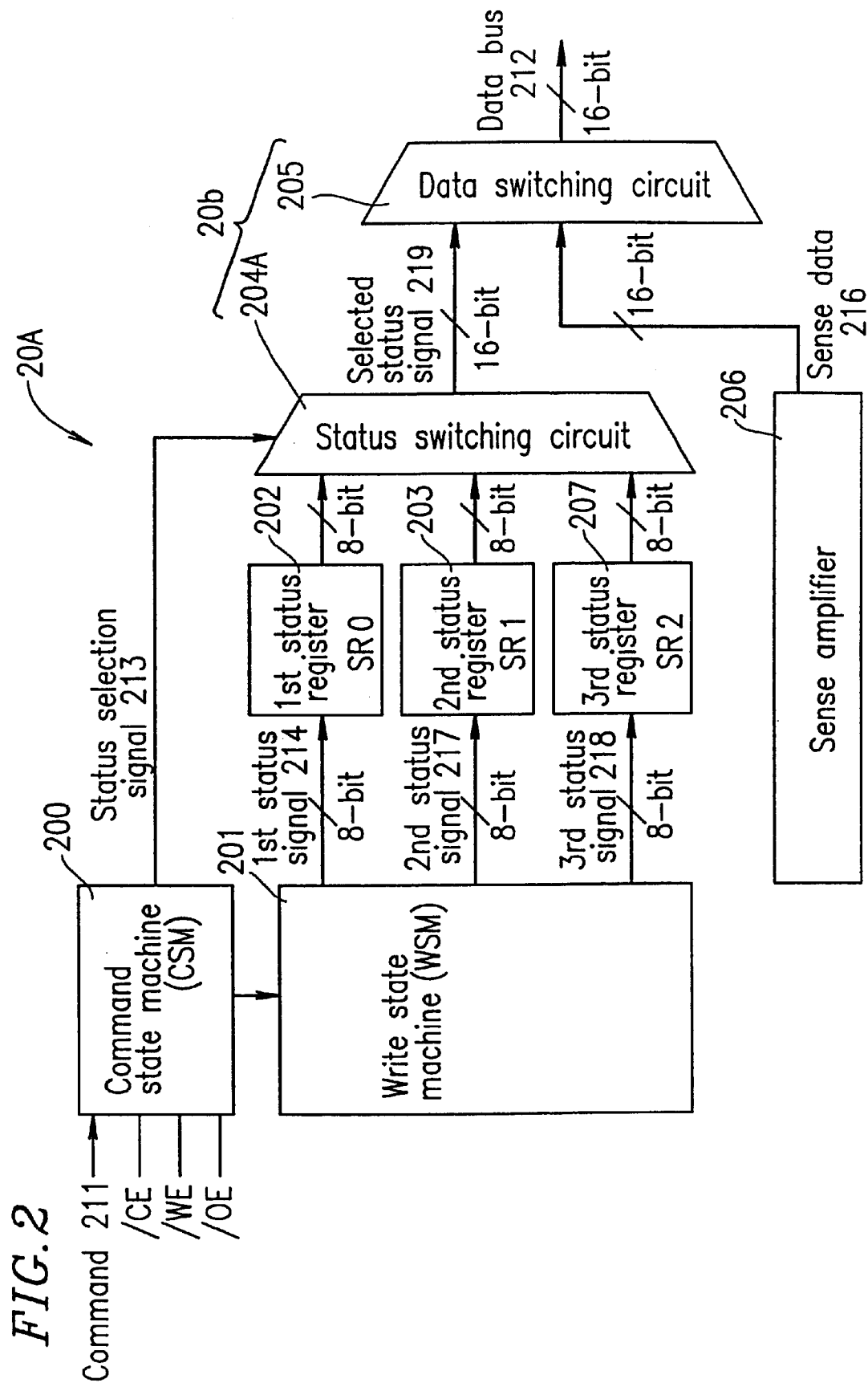
FIG. 2 is a block diagram illustrating a part of a nonvolatile semiconductor memory device including a status register selection circuit according to a second example of the present invention.

FIG. 2 is a block diagram illustrating a part of a nonvolatile semiconductor memory device 20A according to the second example of the present invention, including a status register selection circuit.

The nonvolatile semiconductor memory device 20A shown in FIG. 2 is different from the nonvolatile semiconductor memory device 20 shown in FIG. 1 in the following points. The nonvolatile semiconductor memory device 20A includes a third status register 207 (hereinafter, referred to as "SR2") as a status memory section. SR2 is provided parallel to SR0 and SR1. The status switching circuit 204 shown in FIG. 1 is replaced with a status switching circuit 204A as a third status selection section for selecting a plurality of status registers. The bus for the 8-bit selected status signal 215 shown in FIG. 1 is replaced with a bus for a 16-bit selected status signal 219. The status switching circuit 204A and the data switching circuit 205 form a status register selection circuit 20b (control section). Except for these points, the nonvolatile semiconductor memory device 20A is the same in structure as the nonvolatile semiconductor memory device 20 in FIG. 1. Hereinafter, the above differences will be mainly described.

Based on the status selection signal 213 from the CSM 200 provided for decoding the input command 211, the status switching circuit 20A selects two of SR0, SR1 and SR2 which are relevant to the operation designated by the command 211, and simultaneously outputs the statuses in the selected registers to the 16-bit bus for the selected status signal 219.

In the second example, three status registers SR0, SR1 and SR2 are provided. Alternatively, four or more status registers may be provided. In this case also, the data stored in the status registers selected by the status selection signal 213 which is generated based on the command 211 is simultaneously or sequentially output in any combination to the bus for the selected status signal 219. Three or more status registers may be selected.

The width of the bus for the selected status signal 219 is restricted to equal to or smaller than the width of the data bus 212. In the case where the bus for each of the first, second and third status signals 214, 217 and 218 has a 5-bit or smaller width, the data stored in SR0, SR1 and SR2 can be simultaneously output to the 16-bit bus for the selected status signal 219 depending on the content of the status selection signal 213. When, for example, the bus for each of the first, second and third status signals 214, 217 and 218 has a 5-bit width, the data stored in SR0, SR1 and SR2 can be output simultaneously from the lowest bit to the 15th bit of the bus for the selected status signal 219 in the order of SR0, SR1 and SR2. (More specifically, the data in SR0 is output to the lowest 5 bits of the bus, the data in SR1 is output to the next lowest 5 bits of the bus, and the data in SR2 is output to the next lowest 5 bits of the bus.)

As described above, in the second example, the data in two or more of the plurality of status registers SR0, SR1 and SR2 is output in combination. Thus, a larger number of operation states of the memory chip can be represented than in the first example. Since the two or more status registers are selected by the input command, each status does not need its own command. Thus, the conventional status reading method is usable for the nonvolatile semiconductor memory device 20A.

EXAMPLE 3

In some types of semiconductor memory devices, while a memory operation (for example, block erase or write) is being executed based on a command, data can be read from an arbitrary address of the memory array which is not being processed with the memory operation. In the case where, while data is written to a plurality of addresses, an address to which data has already been written is identified, data can be read from that address. In order to realize this, the address for which the memory operation is being executed needs to be identified. In the third example of the present invention, an address which is being processed with the memory operation (e.g., block erase/write) is stored in a part of the bit structure of the status register. Such an address is included in the data regarding the operation state of the memory array.

FIG. 3 shows a bit structure of a status register in a semiconductor memory device in the third example of the present invention. The bit structure is of the 8-bit status registers used in the first and second examples. As described above, bits 7 through 3 are the same as those in the status register.

As shown in FIG. 3, bit 2 and bit 1, i.e. ADD0 and ADD1, which are not included in the conventional status register store the following data. The CSM 200 (FIG. 1) decodes the input command 211 and transfers the decoding result to the WSM 201. The WSM 201 executes an operation corresponding to the command 211 (for example, block erase/write), and stores, in ADD0 and ADD1, two-bit (or a plurality of bits of) addresses which are being processed with the block erase/write.

For example, when the memory chip is divided into four areas which can be represented by a 2-bit address (here, the areas are referred to as "planes 0, 1, 2 and 3"), (ADD0, ADD1)=(0,0) is set as "plane 0"; (0,1) is set as "plane 1": (1,0) is set as "plane 2"; and (1,1) is set as "plane 3". In this manner, the plane which is being processed with the operation based on the command can be represented by the 2-bit data stored in the status register, and thus data can be read from the plane which has been processed with erase/write.

The number of bits of the status register need not be 8, and can be any number which is equal to or smaller than the width of the data bus 212. In this example, in the case where the memory chip is divided into four or more areas, at least 3 bits are necessary. The position of each bit in the status register is not limited to that shown in FIG. 3.

In the conventional status register, it is confirmed that the WSM 201 is in a busy state by bit 7 as described above. In addition in the third example, the address which is being processed with the operation can be confirmed with bit 2 and bit 1 of the status register. Therefore, the address(es) from which data can be read is identified before all the addresses are processed with the operation based on the command. Such an address can be identified only by reading the data in the status register as in the conventional device, with no special command or input/output bus being required.

Therefore, the conventional status reading method is usable for the semiconductor memory device in the third example.

EXAMPLE 4

In the fourth example of the present invention, identification information of a plurality of status registers is stored in a part of the bit structure of the respective status register. Such identification information is included in the data regarding the operation state of the memory array.

FIG. 4 shows a bit structure of a status register in a semiconductor memory device in the fourth example. The bit structure is of the 8-bit status registers usable in the first and second examples but is different from the bit structure shown in FIG. 3. Bits 7 through 3 and 0 are the same as those in the status register shown in FIG. 3 and the conventional status register.

In FIG. 4, bit 1 ("SRA") and bit 2 ("SRB") store the following data. SRA and SRB are identification information (determination information) for identifying which one of the status registers SR0, SR1 or SR2 is represented by the bit structure. Using 2 bits of SRA and SRB, four status registers SR0, SR1, SR2 and SR3 can be identified.

The number of bits of each status register need not be 8, and can be any number which is equal to or smaller than the width of the data bus 212. The number of bits used for the identification information is determined by the number of status registers to be identified. For example, when the number of status registers is 5 or more and 8 or less, the number of bits required for the identification information is 3.

As described above, in the fourth example, when status information stored in one or a plurality of status registers is read, the status register from which the status information is being read is identified by the bit information in the status register (information in bit 2 and bit 1). Therefore, the conventional status reading method is usable for the semiconductor memory device in the fourth example.

EXAMPLE 5

In the fifth example of the present invention, a status register capable of storing an operation state regarding data transfer will be described.

A semiconductor memory device, including a flash memory array and two SRAM (Static Random Access Memory) arrays integrated on one semiconductor chip, uses a transfer status register as a status memory section for data transfer between each of the SRAM arrays and the flash memory array. More specifically, such a transfer status register will be described in the fifth example.

Figure 5:
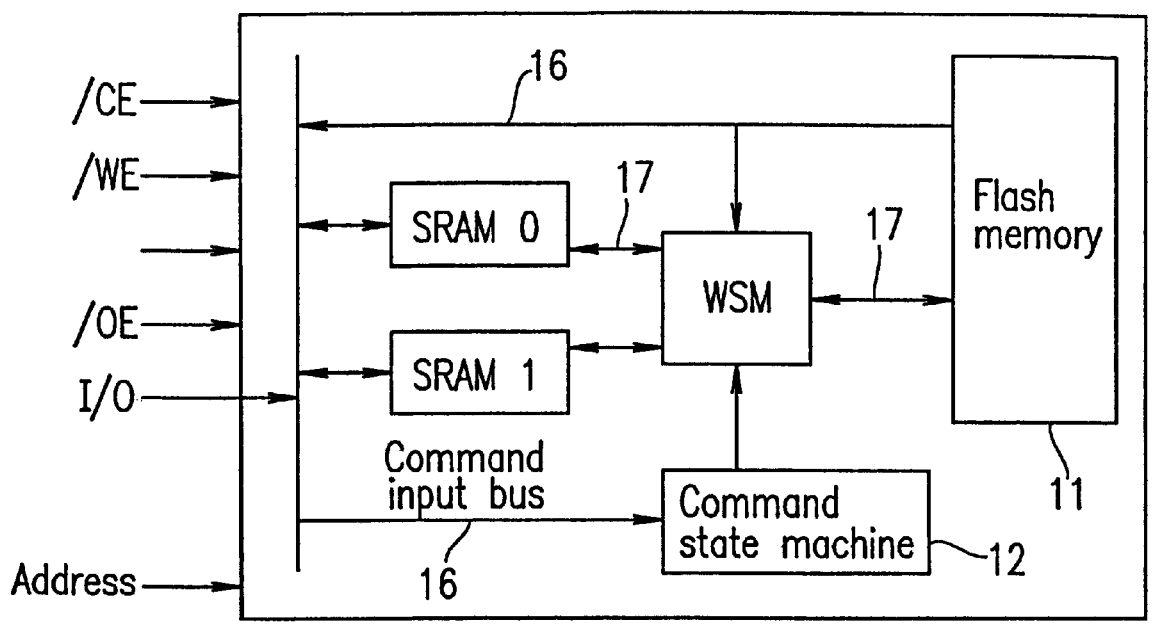
FIG. 5 is a block diagram illustrating a part of a one-chip semiconductor memory device having a data transfer function.

A semiconductor memory device performing such data transfer is disclosed in detail by the Applicant of the present application in Japanese Application No. 2000-176182. As shown in FIG. 5, the semiconductor memory device includes a pair of SRAM arrays SRAM0 and SRAM1. Data can be read from and written to SRAM1 by an external CPU (central processing unit; not shown) via an I/O pin. A flash memory array 11 is provided on the same chip as SRAM0 and SRAM1, but independently from SRAM0 and SRAM1. Each of SRAM0 and SRAM1, and the flash memory array 11 can transfer data to each other via a WSM.

FIGS. 6 and 7 each show a bit structure of a status bit of the semiconductor memory device in the fifth example. FIG. 6 shows a bit structure of a transfer status register (TSR); and FIG. 7 shows a bit structure of a command status register (CSR). In the following description, TSR1, for example, represents the i'th bit of the transfer status register, where i is a natural number.

First, the bit structure of the transfer status register shown in FIG. 6 will be described.

TSR7 (WSMS) represents an operation state of the write state machine. When TSR7="1", the write state machine is in a "wait state" (i.e., the data transfer operation from the HSP (High Speed Plane) described below to the flash memory or from the flash memory to the HSP has been completed). When TSR7="0", the write state machine is in an "operation state" (i.e., the data is being transferred from the HSP to the flash memory or from the flash memory to the HSP). The "HSP" is the SRAM which transfers data to or from the flash memory array. Where the HSP is equally divided into four, each divided part is referred to as an "HSP page" and is represented as "HSP page 0 through HSP-page 3". In FIG. 5, SRAM0 and SRAM1 are each an HSP page.

In FIG. 6, HSP1 represents TSR6, and HSP0 represents TSR5. While data is transferred from an HSP to the flash memory array, the HSP page (page state) from which the data is now being transferred can be confirmed (i.e., the semiconductor memory array can be identified) by a combination of TSR7 through TSR5 (i.e., a plurality of bits). HSP1 is a status bit of HSP page 1, which represents the status of HSP page 1. HSP0 is a status bit of HSP page 0, which represents the status of HSP page 0.

TSR4 (TS) represents a transfer status. The value "1" of TSR4 represents "transfer failure". The value "0" of TSR4 represents "transfer success".

TSR3 (Vccws) represents the state of Vccws (Vccws during transfer represents a terminal for monitoring the level of the supply voltage). When TSR3 "1", Vccws is in the state where "the LOW level of Vccws is detected and the transfer operation is stopped". When TSR3="0", Vccws is in the normal state where "there is no problem with Vccws".

TSR2 (TSS) represents a transfer interrupt status. The value "1" of TSR2 indicates that "transfer is being interrupted". The value "0" of TSR2 indicates that "transfer is being executed or transfer is completed".

TSR1 (DPS) represents a device protection state. The value "1" of TSR1 indicates that "a lock by the device protection bit is detected and therefore the transfer operation is being interrupted". The value "0" of TSR1 represents an "unlocked" state.

TSR0 represents the transfer status register mode (operation mode of outputting status information to be stored in the transfer status register). TSR0 is always "1". If TSR0="0", the status register may represent, for example, a command status register mode described below (see FIG. 7, bit 0 of CSR).

By providing and combining the above-mentioned status bits, various operation states regarding data transfer between each SRAM and the flash memory array can be represented as follows.

TSR7=1, TSR2=0
   Transfer is completed
TSR7=0, TSR6=1, TSR5=1
   HSP page 3 is now being transferred.
TSR7=0, TSR6=1, TSR5=0
   HSP page 2 is now being transferred.
TSR7=0, TSR6=0, TSR5=1
   HSP page 1 is now being transferred.
TSR7=0, TSR6=0, TSR5=0
   HSP page 0 is now being transferred.

As shown above, the state of the HSP pages currently used for transfer can be confirmed by the combination of TSR7, TSR6 and TSR5.

TSR6=1, TSR5=1, TSR52=1

Transfer of HSP page 3 is now being interrupted.

TSR6=1, TSR5=0, TSR2=1

Transfer of HSP page 2 is now being interrupted.

TSR6=0, TSR5=1, TSR2=1

Transfer of HSP page 1 is now being interrupted.

TSR6=0, TSR5=0, TSR2=1

Transfer of HSP page 0 is now being interrupted.

The transfer status register mode changes only when a transfer command is input. Namely, when data in the status register is read after a transfer command is input, TSR0 of the status register shows "1".

Next, the bit structure of the command status register (CSR) shown in FIG. 7 will be described.

CSR7 through CSR1, which represent a command status register mode as an operation mode for outputting status information stored in the command status register (CSR), are the same as those of the conventional status register.

CSR0 representing this mode always shows "0" Unlike the conventional command status register, CSR0 is not reserved for future expansion functions. The value of CSR0 is used for identifying whether the transfer status register mode or the command status register mode is selected. When CSR0=1, the status register shows the transfer status register mode (see FIG. 6, bit 0 of TSR).

As described above, the semiconductor memory device includes two status registers, i.e., a command status register and a transfer status register. Owing to such a structure, the semiconductor memory device can represent a greater number of operation states. The CSM decodes the input command and selects either the command status register mode or the transfer status register mode based on the decoding result. The selected mode can be identified based on the bit of the status register. In addition, the status register is selected by the command without requiring any special command for reading the status register. Thus, the conventional status reading method is usable for the semiconductor memory device in the fifth example. In the transfer status register mode, the address which is currently being involved in data transfer can be identified. Therefore, data can be transferred to the address, from/to which data has already been transferred, while the other addresses are still being involved in data transfer.

Figure 8:
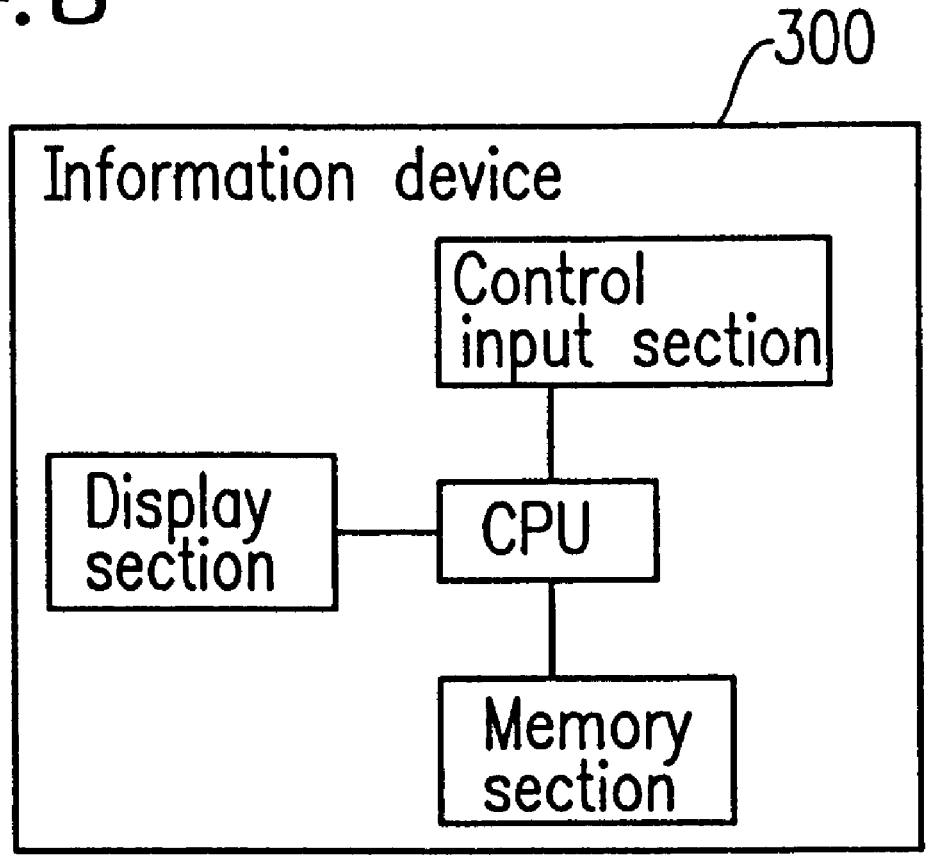
FIG. 8 is a block diagram illustrating a basic structure of an information device including a semiconductor memory device according to the present invention.
Figure 9:
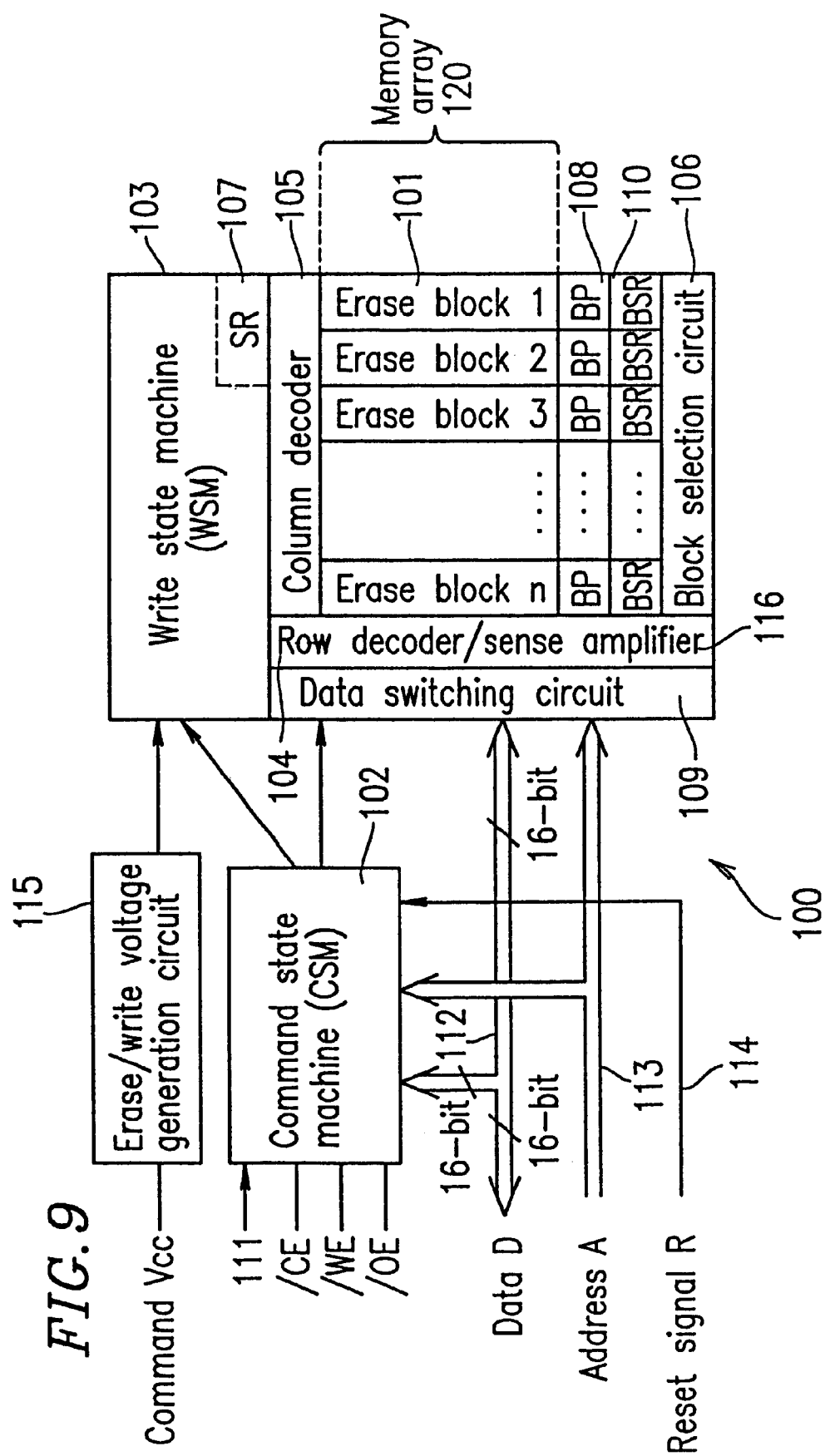
FIG. 9 is a block diagram illustrating a part of a conventional nonvolatile semiconductor memory device.

In the first through fifth examples, the semiconductor memory devices are described. A semiconductor memory device can be easily incorporated into an information device such as, for example, a mobile telephone device or a computer. The same effect as described above is provided. A semiconductor memory device according to the present invention can be easily applicable to an information device 300 as shown in FIG. 8. The information device 300 includes an information memory section such as a RAM (SRAM, DRAM, etc.), a ROM, a flash memory or the like; a control input section; a display section for displaying an initial screen, an information processing result or the like; and a CPU (central processing unit) for receiving a control instruction from the control input section and performing information read/write (memory operation) from/to the information memory section or data transfer with the information memory section based on a prescribed information processing program or data, as well as performing the processing of various information.

The first through fifth example can be summarized as (1) through (27) below. Thus, the objective of the present invention is achieved.

(1) A semiconductor memory device including a status memory section capable of storing data regarding an operation state of a memory array based on a control instruction, wherein a plurality of status memory sections are provided in order to represent a greater number of operation states, the semiconductor memory device further including a first status selection section capable of selectively outputting data stored in a prescribed status memory sections, among the plurality of status memory sections, in accordance with a selection control signal.

(2) A semiconductor memory device including a memory array having a plurality of blocks; a plurality of status memory sections capable of storing data regarding an operation state of the memory array; and a second status selection section for selectively outputting data stored in one of the plurality of status memory sections based on the selection control signal.

(3) A semiconductor memory device including a memory array having a plurality of blocks; a plurality of status memory sections capable of storing data regarding an operation state of the memory array: and a third status selection section for selectively outputting data stored in at least two of the plurality of status memory sections based on the selection control signal.

(4) A semiconductor memory device according to any of (1) through (3), further including a data switching section for selectively outputting either one of (i) data which is selected by any of the first through third status selection sections or (ii) information which is read from the memory array.

(5) A semiconductor memory device according to any of (1) through (4), wherein the data from the status memory section is output to the first data bus, and either the data on the first data bus or the information read from the memory array is output to a second data bus.

(6) A semiconductor memory device according to any of (1) through (5), wherein at least one of the first through third status selection sections is controlled by the selection control signal based on the input control instruction.

(7) A semiconductor memory device according to (6), wherein an input command of the input control instruction is decoded; the semiconductor memory device includes a selection control signal generation section for generating the selection control signal based on the decoding result; and at least one of the first through third status selection sections is controlled by the selection control signal based on the input control instruction.

(8) A semiconductor memory device according to (5), wherein the first data bus has a width which is equal to or less than a width of the second data bus.

(9) A semiconductor memory device according to (5) or (8), wherein the status memory section includes a status register; and the width of the first data bus is equal to or greater than a bit width of the status register.

(10) A semiconductor memory device according to (3), wherein the width of the first data bus for simultaneously outputting the data from at least two of the plurality of status selection sections is equal to or greater than a sum of the bit widths of the data selectively output.

(11) A semiconductor memory device according to any of (1) through (10), wherein the status memory section is capable of storing an address which is currently being processed with erase/write.

(12) A semiconductor memory device according to any of (1) through (10), wherein the status memory section is capable of storing determination information of the status memory section.

(13) A semiconductor memory device including a plurality of semiconductor memory arrays integrated on one chip, the plurality of semiconductor memory arrays being capable of transferring data from/to each other, the semiconductor memory device including a status memory section capable of storing data on an operation state regarding data transfer.

(14) A semiconductor memory device according to (13), wherein the status memory section includes a first bit representing the operation state of the write state machine.

(15) A semiconductor memory device according to (14), wherein when the value "1" of the first bit indicates that the write state machine is in a wait state, and the value "0" of the first bit indicates that the write state machine is in operation.

(16) A semiconductor memory device according to any of (13) through (15), wherein the status memory section includes a plurality of second bits representing the page state of the plurality of semiconductor memory arrays.

(17) A semiconductor memory device according to (16), wherein the plurality of semiconductor memory arrays are identified by the plurality of second bits.

(18) A semiconductor memory device according to any of (13) through (17), wherein the status memory section includes a third bit representing a transfer status.

(19) A semiconductor memory device according to (18), wherein the value "1" of the third bit represents a transfer failure state, and the value "0" of the third bit represents a transfer success state.

(20) A semiconductor memory device according to any of (13) through (19), wherein the status memory section includes a fourth bit representing a supply voltage level detection state.

(21) A semiconductor memory device according to (20), wherein the value "1" of the fourth bit represents a LOW level detection state, and the value "0" of the fourth bit represents a normal level detection state.

(22) A semiconductor memory device according to any of (13) through (21), wherein the status memory section includes a fifth bit representing a transfer interrupt status.

(23) A semiconductor memory device according to (22), wherein the value "1" of the fifth bit indicates that the transfer is being interrupted, and the value "0" of the fifth bit indicates that the transfer is being executed or the transfer is completed.

(24) A semiconductor memory device according to any of (13) through (23), wherein the status memory section includes a sixth bit representing a device protection state.

(25) A semiconductor memory device according to (24), wherein the value "1" of the sixth bit indicates that the lock by the block lock bit is detected and the operation is currently stopped, and the value "0" of the sixth bit represents an unlocked state.

(26) A semiconductor memory device according to any of (13) through (25), wherein the status memory section includes a seventh bit for identifying a status register mode.

(27) A semiconductor memory device according to (26), wherein the value "1" of the seventh bit represents a transfer status register mode, and the value "0" of the seventh bit represents a command status register mode.

EXAMPLE 6

Figure 10:
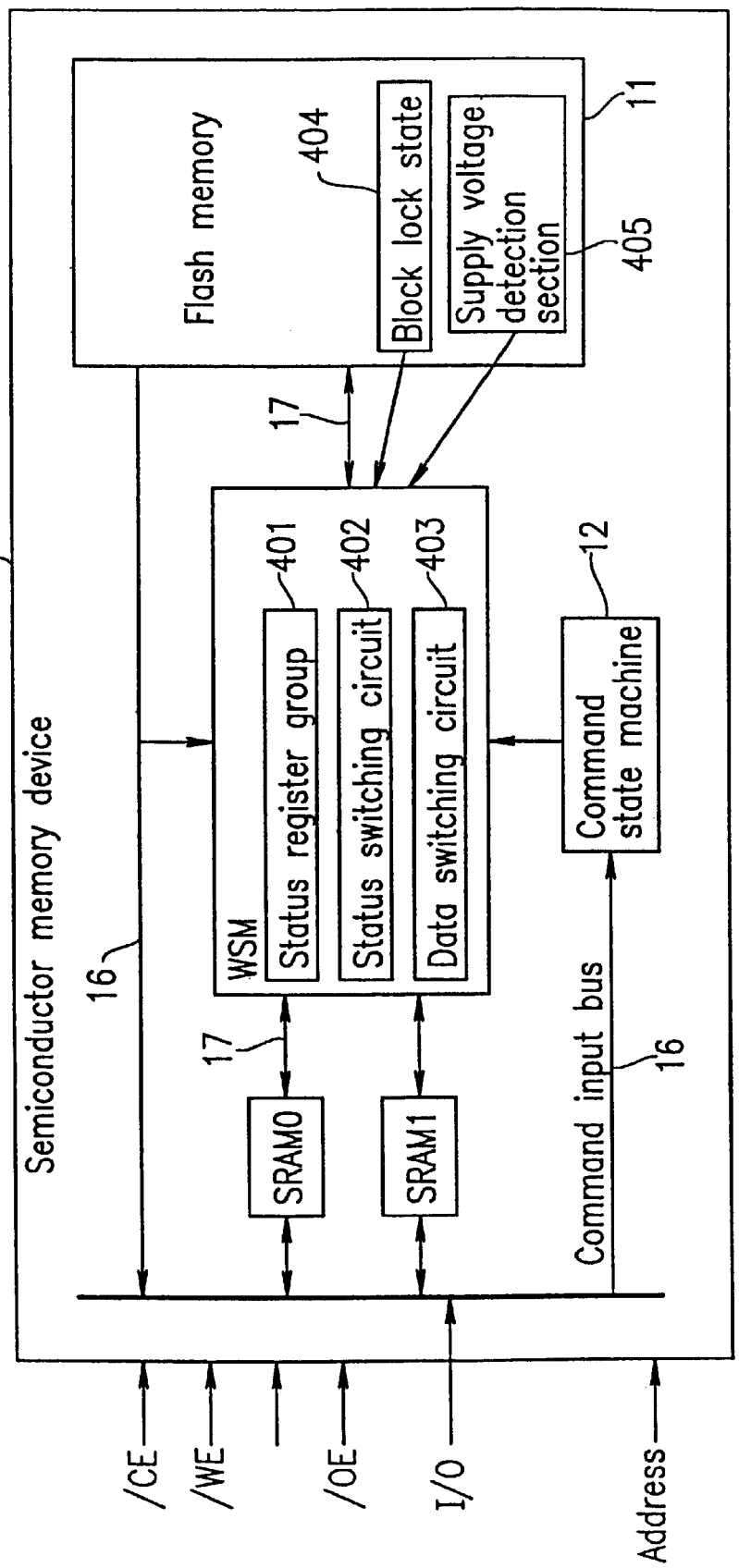
FIG. 10 is a block diagram illustrating a semiconductor memory device according to a sixth example of the present invention.

With reference to FIG. 10, a semiconductor memory device 400 according to a sixth example of the present invention will be described.

The semiconductor memory device 400 includes a plurality of memory arrays (i.e., a flash memory array 11 and SRAM arrays SRAM0 and SRAM1), and a WSM. The flash memory array 11, SRAM0 and SRAM1 are operable independently of each other. Each of SRAM0 and SRAM1, and the flash memory array 11 can transfer data to one another via the WSM. The WSM includes a status register group 401 including a plurality of status registers for storing various types of state information regarding the semiconductor memory device 400 including the plurality of memory arrays, a status switching circuit 402 as a first switching circuit for receiving data from the status register group 401 and selectively outputting data from one or at least two of the status registers to a first data bus, and a data switching circuit 403 as a second switching circuit for receiving data from the first data bus and data from a sense amplifier (not shown in FIG. 10) and selectively outputting either one of the data to a second data bus. The flash memory 11 includes a memory information protection section (block lock state) 404 and a supply voltage detection section 405.

The status register group 401, including the plurality of status registers, includes a first status register group including at least one status register for storing state information regarding an operation common to the semiconductor memory device 400, and a second status register group including at least one status register for storing state information regarding a data transfer operation between the plurality of memory arrays. The first and second status register groups each include, for example, information which identifies whether each status register belongs to the first status register group or the second status register group, or information on an address which is currently being processed with an operation designated by the command. Especially, the second status register group includes, for example, data transfer result information which indicates whether or not the data transfer operation between the plurality of memory arrays has successfully been completed, or information which indicates whether the data transfer operation between the plurality of memory arrays is currently being executed or interrupted.

The second status register group includes information which indicates whether the supply voltage is normal or abnormal while the data transfer operation between the plurality of memory arrays is being executed, based on a detection result of the supply voltage detection section 405. The second status register group also includes information which represents a protection state against the rewrite operation and further indicates that the data transfer operation has been interrupted by detecting the protection state when the command instructs the data transfer operation to the memory arrays which are protected against the rewrite operation.

The supply voltage detection section 405 is used as follows. While the WSM is performing an operation (e.g., data transfer, write, or erase), the supply voltage detection section 405 may write information, which indicates that the supply voltage is abnormal, in one of the status registers in the WSM. Upon reading the information, the WSM interrupts or terminates the operation.

The memory information protection section (block lock state) 404 is used as follows. Before the WSM starts an operation (e.g., data transfer, write, or erase), the WSM determines whether or not to perform the operation, based on the information sent to one of the status registers in the WSM from the block lock state 404. For example, when the information received from the block lock state 404 indicates that rewrite should be prohibited, the above-mentioned operation is not performed.

As described above, a semiconductor memory device of the present invention includes a plurality of status memory sections, so that various operation states of the semiconductor memory device can be represented. The plurality of status memory sections are selected by the decoding result of the input command, without requiring a read control instruction (command) for each status. Therefore, the conventional status reading method is usable for the semiconductor memory device of the present invention.

By outputting contents stored in the plurality of status memory sections in combination, various operation states of a grater number of memory chips (memory arrays) can be represented. In this case also, the plurality of status memory sections are selected by the decoding result of the input command, without requiring a read control instruction (command) for each status. Therefore, the conventional status reading method is usable for the semiconductor memory device of the present invention.

In addition to confirming the busy state of the write state machine by bit 7 as in the conventional status memory section, the semiconductor memory device according to the present invention can identify the address which is currently being processed with the memory operation by a plurality of bits, for example, bit 2 and bit 1. The address(es) from which data can be read is identified before all the addresses are processed with the operation based on the command. Such an address can be identified only by reading the data in the status register as in the conventional device, with no special command or input/output bus being required. Therefore, the conventional status reading method is usable for the semiconductor memory device in the third example.

When one of the plurality of statuses is read without using any special command for reading data stored in the status memory section, the status data which is currently being read is identified by the bits of the status memory section. Therefore, the conventional status reading method is usable for the semiconductor memory device of the present invention.

Since there are two status memory sections for a command status and a transfer status, a greater number of operation states can be represented. Either the command status mode or the transfer status mode is selected in accordance with the command. Which mode is being used can be identified by the bits in the status memory section. Since each status memory section is selected by the command, any special command for reading the status register is not necessary. Therefore, the conventional status reading method is usable for the semiconductor memory device of the present invention. In the transfer status register mode, the address which is currently being involved in the data transfer can be identified. Therefore, even before data transfer from/to all the addresses is completed, data can be transferred to the address, from which data has been transferred.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device in which an input command controls an operation, the semiconductor memory device comprising:
   a command state machine for decoding the input command and outputting the decoding result;
   a plurality of status registers for storing state information of the semiconductor memory device;
   a first switching circuit for receiving data from the plurality of status registers, and selectively outputting the data from at least one of the plurality of status registers to a first data bus; and
   a second switching circuit for receiving the data on the first data bus and data from a sense amplifier, and selectively outputting either one of data to a second data bus,
   wherein at least the first switching circuit, among the first and second switching circuits, is controlled by the decoding result output by the command state machine.

2. A semiconductor memory device according to claim 1, wherein at least one of the plurality of status registers includes identification information for exclusively identifying the status register.

3. A semiconductor memory device according to claim 2, wherein at least one of the plurality of status registers includes information on an address which is currently being processed with an operation designated by the input command.

4. A semiconductor memory device according to claim 1, wherein at least one of the plurality of status registers includes information on an address which is currently being processed with an operation designated by the input command.

5. A semiconductor memory device according to claim 1, comprising a control section for, after the command is input, controlling the state information, stored in the plurality of status registers, to be externally output in accordance with a read control signal which is input to an external control terminal.

6. A semiconductor memory device according to claim 1, wherein the first data bus has a width which is equal to or less than a width of the second data bus.

7. A semiconductor memory device including a plurality of memory arrays which are independently operable and having a function of transferring data between the plurality of memory arrays, the semiconductor memory device comprising:
   a plurality of status registers for storing state information of the plurality of memory arrays;
   a first switching circuit for receiving data from the plurality of status registers, and selectively outputting the data from at least one of the plurality of status registers to a first data bus; and
   a second switching circuit for receiving the data on the first data bus and data from a sense amplifier, and selectively outputting either one of the data to a second data bus.

8. An information device for performing at least one of a data transfer operation and a memory operation using a semiconductor memory device according to claim 1.

9. A semiconductor memory device according to claim 7, wherein an input command controls an operation, the semiconductor memory device further comprising a command state machine for decoding the input command and outputting the decoding result, wherein the first switching circuit and the second switching circuits are controlled by the decoding result output by the command state machine.

10. A semiconductor memory device according to claim 9, wherein the plurality of status registers include a first status register group including at least one status register for storing state information regarding an operation common to the semiconductor memory device, and a second status register group including at least one status register for storing state information regarding a data transfer operation between the plurality of memory arrays.

11. A semiconductor memory device according to claim 7, wherein the plurality of status registers include a first status register group including at least one status register for storing state information regarding an operation common to the semiconductor memory device, and a second status register group including at least one status register for storing state information regarding a data transfer operation between the plurality of memory arrays.

12. A semiconductor memory device according to claim 11, wherein the first and second status register groups each include information which identifies whether the status register belongs to the first status register group or the second status register group.

13. A semiconductor memory device according to claim 12, wherein the first and second status register groups each include information which exclusively identifies the respective status register.

14. A semiconductor memory device according to claim 11, wherein the first and second status register groups each include information which exclusively identifies the respective status register.

15. A semiconductor memory device according to claim 11, wherein the second status register group includes information on an address which is currently being processed with an operation designated by the command.

16. A semiconductor memory device according to claim 11, comprising a control section for, after the command is input, controlling the state information, stored in the first and second status register groups, to be externally output in accordance with a read control signal which is input to an external control terminal.

17. A semiconductor memory device according to claim 11, further comprising a write state machine for receiving the decoding result of the command output by the command state machine and controlling execution of an operation designated by the command based on the decoding result, wherein the second status register group includes information which indicates whether or not the write state machine is currently executing the data transfer operation between the plurality of memory arrays.

18. A semiconductor memory device according to claim 11, wherein:
   at least one of the plurality of memory arrays is capable of being accessed at a higher speed than other memory arrays,
   the at least one memory array capable of being accessed at a higher speed is divided into a plurality of pages, which are memory areas, and
   the second status register group includes, information which represents the page which is currently being involved in the data transfer operation between the at least one of the plurality of memory arrays capable of being accessed at a higher speed and the other memory arrays.

19. A semiconductor memory device according to claim 18, wherein the at least one of the plurality of memory arrays capable of being accessed at a higher speed is a static random access memory, and the other memory arrays include a nonvolatile semiconductor memory device capable of electrically writing and erasing data.

20. A semiconductor memory device according to claim 11, wherein the second status register group includes data transfer result information which indicates whether or not the data transfer operation between the plurality of memory arrays has successfully been completed.

21. A semiconductor memory device according to claim 11, further comprising a supply voltage detection section for detecting a supply voltage, wherein the second status register group includes information which indicates whether or not the supply voltage is abnormal while the data transfer operation between the plurality of memory arrays is being executed.

22. A semiconductor memory device according to claim 11, wherein the second status register group includes information which indicates whether the data transfer operation between the plurality of memory arrays is currently being executed or interrupted.

23. A semiconductor memory device according to claim 11, further comprising an information protection section for protecting stored information against a rewrite operation to the plurality of memory arrays, wherein the second status register group includes information which represents a protection state against the rewrite operation and also indicates that the data transfer operation has been interrupted by detecting the protection state when the command instructs the data transfer operation to the memory arrays which are protected against the rewrite operation.

24. A semiconductor memory device according to claim 11, wherein the first data bus has a width which is equal to or greater than a bit width of the first status register group or the second status register group.

25. A semiconductor memory device according to claim 11, wherein the first data bus has a width which is equal to or greater than a sum of a bit width of the first status register group and a bit width of the second status register group.

26. A semiconductor memory device according to claim 7, wherein the first data bus has a width which is equal to or less than a width of the second data bus.

27. An information device for performing at least one of a data transfer operation and a memory operation using a semiconductor memory device according to claim 7.

* * * * *